US010580861B2

(12) United States Patent
Dosev et al.

(10) Patent No.: US 10,580,861 B2
(45) Date of Patent: Mar. 3, 2020

(54) TRENCH SEMICONDUCTOR DEVICE LAYOUT CONFIGURATIONS

(71) Applicants: Polar Semiconductor, LLC, Bloomington, MN (US); SANKEN ELECTRIC CO., LTD., Saitama (JP)

(72) Inventors: Dosi Dosev, Woodbury, MN (US); Don Rankila, Farmington, MN (US); Tatsuya Kamimura, St. Louis Park, MN (US); Shunsuke Fukunaga, Saitama (JP); Steven Kosier, Lakeville, MN (US); Peter West, Minneapolis, MN (US)

(73) Assignees: POLAR SEMICONDUCTOR, LLC, Bloomington, MN (US); SANKEN ELECTRIC CO., LTD., Saitama (JP)

( * ) Notice: Subject to any disclaimer, the term of this patent is extended or adjusted under 35 U.S.C. 154(b) by 0 days.

(21) Appl. No.: 15/900,571

(22) Filed: Feb. 20, 2018

(65) Prior Publication Data

US 2018/0175146 A1 Jun. 21, 2018

Related U.S. Application Data

(62) Division of application No. 15/051,642, filed on Feb. 23, 2016, now abandoned.

(60) Provisional application No. 62/119,555, filed on Feb. 23, 2015.

(51) Int. Cl.
*H01L 29/06* (2006.01)
*H01L 29/78* (2006.01)

(52) U.S. Cl.
CPC ...... *H01L 29/0692* (2013.01); *H01L 29/0696* (2013.01); *H01L 29/7811* (2013.01); *H01L 29/0653* (2013.01)

(58) Field of Classification Search
CPC .................. H01L 21/76286; H01L 29/0642
See application file for complete search history.

(56) References Cited

U.S. PATENT DOCUMENTS

| | | | | |
|---|---|---|---|---|
| 4,796,070 A * | 1/1989 | Black | ..................... | H01L 29/063 257/328 |
| 4,974,059 A * | 11/1990 | Kinzer | ................. | H01L 29/0696 257/342 |
| 5,597,765 A * | 1/1997 | Yilmaz | .................. | H01L 29/402 257/E29.201 |
| 5,622,890 A * | 4/1997 | Beasom | ................. | H01L 21/768 257/E21.575 |
| 5,977,609 A * | 11/1999 | Soderbarg | ............. | H01L 21/763 257/501 |
| 5,998,833 A | 12/1999 | Baliga | | |

(Continued)

*Primary Examiner* — Earl N Taylor
(74) *Attorney, Agent, or Firm* — Daly, Crowley, Mofford & Durkee, LLP

(57) ABSTRACT

A trench semiconductor device includes a layer of semiconductor material, an exterior trench pattern formed in the layer of semiconductor material, and an interior trench pattern formed in the layer of semiconductor material, at least partially surrounded by the exterior trench pattern. The exterior trench pattern includes a plurality of exterior trench portions that are each lined with dielectric material and filled with conductive material, and the interior trench pattern includes a plurality of interior trench portions that are each lined with dielectric material and filled with conductive material.

9 Claims, 19 Drawing Sheets

(56) References Cited

U.S. PATENT DOCUMENTS

| | | | | |
|---|---|---|---|---|
| 6,057,558 A * | 5/2000 | Yamamoto | H01L 29/0847 | 257/330 |
| 6,060,747 A * | 5/2000 | Okumura | H01L 29/0696 | 257/331 |
| 6,104,054 A * | 8/2000 | Corsi | H01L 21/76264 | 257/301 |
| 6,392,290 B1 * | 5/2002 | Kasem | H01L 21/6835 | 257/678 |
| 6,429,481 B1 * | 8/2002 | Mo | H01L 29/0696 | 257/331 |
| 6,445,036 B1 * | 9/2002 | Maruoka | H01L 29/0696 | 257/330 |
| 6,476,443 B1 * | 11/2002 | Kinzer | H01L 29/0696 | 257/329 |
| 6,683,363 B2 * | 1/2004 | Challa | H01L 21/763 | 257/496 |
| 6,822,288 B2 * | 11/2004 | Hshieh | H01L 29/7813 | 257/330 |
| 6,838,722 B2 * | 1/2005 | Bhalla | H01L 21/823487 | 257/301 |
| 6,838,735 B1 * | 1/2005 | Kinzer | H01L 29/0696 | 257/270 |
| 6,891,223 B2 | 5/2005 | Krumrey et al. | | |
| 7,005,351 B2 | 2/2006 | Henninger et al. | | |
| 7,250,343 B2 * | 7/2007 | Kotek | H01L 29/407 | 438/270 |
| 7,348,244 B2 * | 3/2008 | Aoki | H01L 21/28194 | 257/E21.419 |
| 7,352,036 B2 * | 4/2008 | Grebs | H01L 29/0653 | 257/332 |
| 7,535,057 B2 * | 5/2009 | Yang | H01L 29/407 | 257/335 |
| 7,595,542 B2 * | 9/2009 | Park | H01L 29/0634 | 257/495 |
| 7,638,841 B2 * | 12/2009 | Challa | H01L 21/3065 | 257/331 |
| 7,652,326 B2 * | 1/2010 | Kocon | H01L 21/3065 | 257/328 |
| 7,772,673 B1 * | 8/2010 | Yin | H01L 21/763 | 257/510 |
| 7,795,137 B2 * | 9/2010 | Saito | H01L 21/76898 | 257/519 |
| 7,842,969 B2 * | 11/2010 | Marreiro | H01L 27/0255 | 257/173 |
| 7,999,312 B2 * | 8/2011 | Takaya | H01L 29/0623 | 257/330 |
| 8,084,865 B2 * | 12/2011 | Hirler | H01L 29/7813 | 257/330 |
| 8,138,575 B2 * | 3/2012 | Stecher | H01L 21/761 | 257/520 |
| 8,148,749 B2 * | 4/2012 | Grebs | H01L 23/544 | 257/172 |
| 8,174,067 B2 * | 5/2012 | Yedinak | H01L 29/0692 | 257/328 |
| 8,304,829 B2 * | 11/2012 | Yedinak | H01L 29/0634 | 257/301 |
| 8,330,247 B2 * | 12/2012 | Marenco | H01L 27/0694 | 257/520 |
| 8,354,730 B2 * | 1/2013 | Moriya | H01L 21/76232 | 257/520 |
| 8,674,440 B2 * | 3/2014 | Korec | H01L 21/8234 | 257/341 |
| 8,722,502 B2 * | 5/2014 | Uchiyama | H01L 21/76264 | 257/E23.011 |
| 8,786,045 B2 * | 7/2014 | Challa | H01L 21/3065 | 257/490 |
| 8,872,278 B2 * | 10/2014 | Hao | H01L 29/4236 | 257/401 |
| 8,928,077 B2 * | 1/2015 | Lee | H01L 29/66712 | 257/328 |
| 9,048,107 B2 * | 6/2015 | Eguchi | H01L 27/0676 | |
| 9,087,911 B2 * | 7/2015 | Alexandrov | H01L 29/8083 | |
| 9,252,251 B2 * | 2/2016 | Hirler | H01L 29/1045 | |
| 9,356,133 B2 * | 5/2016 | Kocon | H01L 29/7811 | |
| 9,391,135 B1 * | 7/2016 | Grivna | H01L 29/7397 | |
| 9,397,213 B2 * | 7/2016 | Qin | H01L 21/26513 | |
| 9,431,481 B2 * | 8/2016 | Lee | H01L 29/74 | |
| 9,680,003 B2 * | 6/2017 | Qin | H01L 29/7813 | |
| 9,722,075 B2 * | 8/2017 | Soeno | H01L 29/7827 | |
| 2002/0071086 A1 * | 6/2002 | Kim | G02F 1/1345 | 349/152 |
| 2002/0167071 A1 * | 11/2002 | Wang | H01L 23/585 | 257/620 |
| 2004/0021195 A1 * | 2/2004 | Kurosaki | H01L 29/0619 | 257/506 |
| 2005/0006700 A1 * | 1/2005 | Cao | H01L 29/0696 | 257/328 |
| 2005/0032287 A1 * | 2/2005 | Nakazawa | H01L 29/66727 | 438/197 |
| 2005/0151190 A1 * | 7/2005 | Kotek | H01L 29/407 | 257/341 |
| 2005/0161735 A1 * | 7/2005 | Aoki | H01L 21/28194 | 257/330 |
| 2005/0167742 A1 * | 8/2005 | Challa | H01L 21/3065 | 257/328 |
| 2005/0224848 A1 * | 10/2005 | Kurosaki | H01L 29/0619 | 257/288 |
| 2006/0044487 A1 * | 3/2006 | Okada | G02F 1/136286 | 349/46 |
| 2006/0193977 A1 * | 8/2006 | Nagura | H01L 21/76283 | 427/209 |
| 2006/0194410 A1 * | 8/2006 | Sugaya | H01L 21/76286 | 438/424 |
| 2006/0214221 A1 * | 9/2006 | Challa | H01L 21/3065 | 257/328 |
| 2006/0226475 A1 * | 10/2006 | Yamamoto | H01L 29/0696 | 257/330 |
| 2006/0267044 A1 * | 11/2006 | Yang | H01L 29/407 | 257/141 |
| 2007/0001230 A1 * | 1/2007 | Lee | H01L 29/0634 | 257/367 |
| 2007/0029597 A1 * | 2/2007 | Lee | H01L 29/0634 | 257/302 |
| 2008/0135931 A1 * | 6/2008 | Challa | H01L 21/3065 | 257/331 |
| 2008/0142883 A1 * | 6/2008 | Grebs | H01L 29/0653 | 257/334 |
| 2008/0265276 A1 * | 10/2008 | Noda | H01L 29/0619 | 257/139 |
| 2009/0008709 A1 * | 1/2009 | Yedinak | H01L 21/3065 | 257/331 |
| 2009/0230561 A1 * | 9/2009 | Zundel | H01L 29/407 | 257/774 |
| 2010/0155879 A1 * | 6/2010 | Schulze | H01L 27/0207 | 257/503 |
| 2010/0207205 A1 * | 8/2010 | Grebs | H01L 23/544 | 257/334 |
| 2010/0224932 A1 * | 9/2010 | Takaya | H01L 29/0623 | 257/330 |
| 2012/0153386 A1 * | 6/2012 | Hirler | H01L 29/7801 | 257/334 |
| 2013/0181252 A1 * | 7/2013 | Eguchi | H01L 27/0676 | 257/109 |
| 2013/0193502 A1 * | 8/2013 | Kocon | H01L 29/7811 | 257/302 |
| 2013/0307060 A1 * | 11/2013 | Wang | H01L 29/42372 | 257/330 |
| 2014/0034999 A1 * | 2/2014 | Korec | H01L 29/7393 | 257/140 |
| 2014/0035032 A1 * | 2/2014 | Korec | H01L 21/8234 | 257/337 |
| 2014/0035047 A1 * | 2/2014 | Korec | H01L 27/0629 | 257/368 |
| 2014/0035102 A1 * | 2/2014 | Korec | H01L 27/082 | 257/566 |
| 2014/0284701 A1 * | 9/2014 | Korec | H01L 29/7824 | 257/328 |

(56) References Cited

U.S. PATENT DOCUMENTS

| | | | |
|---|---|---|---|
| 2014/0361349 A1* | 12/2014 | Alexandrov | H01L 29/8083 257/263 |
| 2016/0013267 A1* | 1/2016 | Lee | H01L 29/0623 257/495 |
| 2016/0240653 A1* | 8/2016 | Kocon | H01L 29/7811 |
| 2016/0240667 A1* | 8/2016 | Kocon | H01L 29/7811 |
| 2016/0247879 A1* | 8/2016 | Dosev | H01L 29/0692 |
| 2016/0343802 A1* | 11/2016 | Korec | H01L 27/0629 |
| 2018/0175146 A1* | 6/2018 | Dosev | H01L 29/0692 |

* cited by examiner

TRENCH SEMICONDUCTOR DEVICE LAYOUT CONFIGURATIONS

CROSS-REFERENCE TO RELATED APPLICATION(S)

This application is a divisional of U.S. application Ser. No. 15/051,642, filed Feb. 23, 2016 for "Trench Semiconductor Device Layout Configurations" by D. Dosev et al., which claims the benefit of U.S. Provisional Application No. 62/119,555 filed Feb. 23, 2015 for "Trench Semiconductor Device Layout Configurations" by D. Dosev et al.

INCORPORATION BY REFERENCE

U.S. application Ser. No. 15/051,642 and U.S. Provisional Application No. 62/119,555 are hereby incorporated herein by reference in their entireties.

BACKGROUND

The present invention relates to geometric layouts of trench semiconductor devices.

In many semiconductor devices, such as modern power MOSFET devices, it is desirable for the device to provide a high breakdown voltage that prevents reverse biasing and avalanche breakdown of the diode barriers of the device. In these devices, application of a reverse bias voltage across a diode barrier creates a depletion region in which the voltage gradient present there causes acceleration of charge carriers and the formation of electron-hole pairs by collisions between the charge carriers and dopant atoms. The electron-hole pairs generally migrate to opposite sides of the depletion region; however, higher levels of reverse bias voltage create higher electric fields in the depletion region, which accelerate the electron-hole pairs to a degree that results in further collisions that form further electron-hole pairs. This multiplication of charge carriers can eventually result in conduction of current in the reverse direction across the diode barrier, which is the condition known as avalanche breakdown of the device.

One technique that has been successfully employed to increase the breakdown voltage of a MOSFET device is to form the device as a trench semiconductor device. A trench semiconductor device consists of a plurality of parallel, interior MOS trenches formed in a semiconductor layer, with each trench being lined with dielectric material and then filled with a conductive material such as metal or doped polysilicon. In addition, an exterior trench is formed around an outside region of the device, having at least a portion generally perpendicular to the interior trenches. The gaps between the trenches effectively terminate the electric fields that tend to converge at the edges of the conductive legs formed in each trench, which results in a higher breakdown voltage. U.S. Pat. No. 6,683,363 illustrates an example of a trench semiconductor device.

Further developments in the geometry of a trench semiconductor device can provide characteristics and results that advance the state of the art, such as in terms of performance, cost, space efficiency, or others, or to simply provide an alternative configuration that may be appropriate for selected applications.

SUMMARY

A trench semiconductor device includes a layer of semiconductor material, an exterior trench pattern formed in the layer of semiconductor material, and an interior trench pattern formed in the layer of semiconductor material, at least partially surrounded by the exterior trench pattern. The exterior trench pattern includes a plurality of exterior trench portions that are each lined with dielectric material and filled with conductive material, and the interior trench pattern including a plurality of interior trench portions that are each lined with dielectric material and filled with conductive material. Various embodiments of the trench semiconductor device with unique trench patterns are disclosed. The various trench patterns provide configurations and/or performance characteristics that may be suitable for particular applications of the devices.

DETAILED DESCRIPTION

Figure 1A:
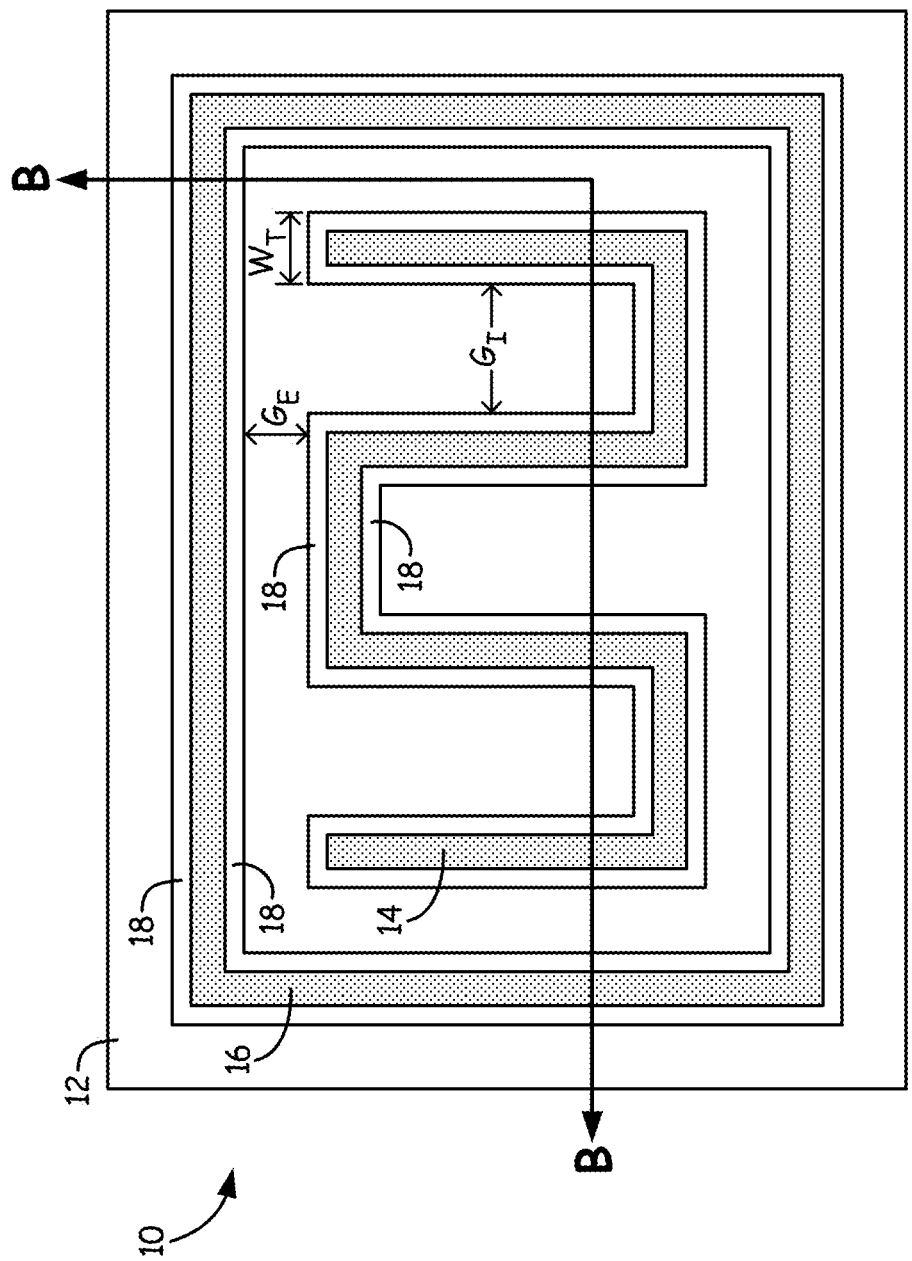
FIG. 1A is a top plan view of a MOSFET device formed as a trench semiconductor device according to an embodiment of the present invention.
Figure 1B:
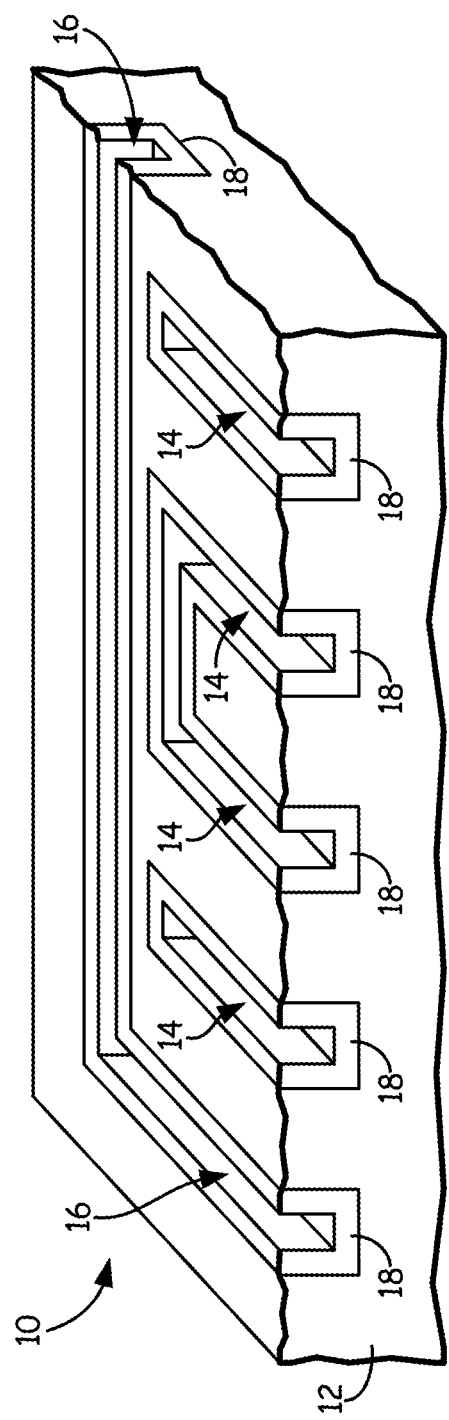
FIG. 1B is a perspective view of the MOSFET device shown in FIG. 1A, sectioned at line B-B in FIG. 1A.

FIG. 1A is a top plan view of MOSFET device 10 formed as a trench semiconductor device according to an embodiment of the present invention. FIG. 1B is a perspective view of MOSFET device 10 sectioned at line B-B in FIG. 1A. As shown in FIGS. 1A and 1B, MOSFET device 10 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. A metal layer (not shown) is formed over the entire structure, so that a metal/semiconductor barrier is formed where the metal layer adjoins the mesa regions of semiconductor layer 12 between interior trenches 14.

As best illustrated in FIG. 1A, interior trenches 14 are formed in a snake pattern enclosed by exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, gap distance $G_I$ may be about 2 micrometers (μm), trench width $W_T$ may be about 1.4 μm, and gap distance $G_E$ may be about 2 μm.

FIGS. 2-16 are top plan views of MOSFET devices formed as trench semiconductor devices with alternative trench patterns. Only top plan views of these embodiments are shown, for simplicity, as the nature of the perspective view of each embodiment (similar to that shown in FIG. 1B) will be apparent to those skilled in the art based on the configuration illustrated in the corresponding top plan view. A fill pattern is used in FIGS. 2-16 to illustrate the trench patterns, for ease of understanding.

Figure 2:
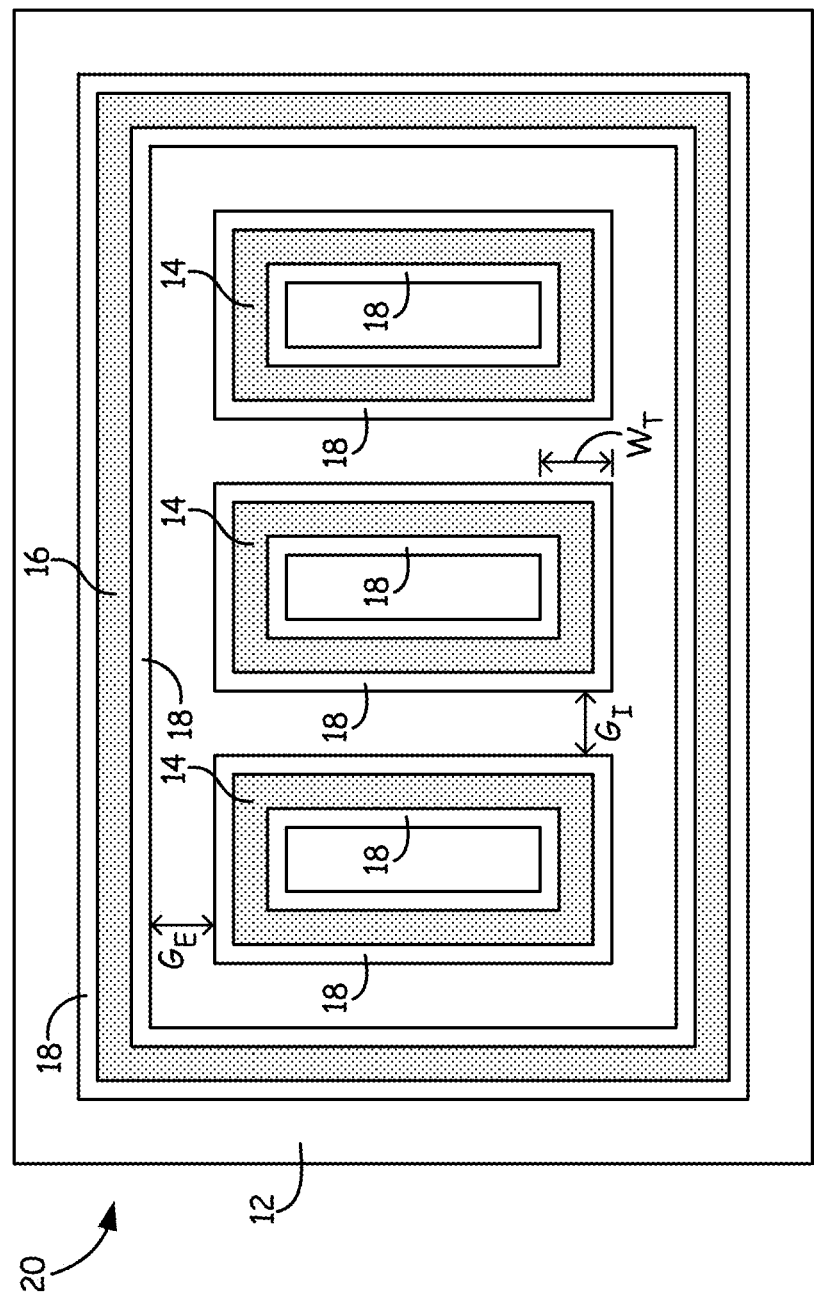
FIGS. 2-16 are top plan views of MOSFET devices formed as trench semiconductor devices according to various embodiments of the present invention.

FIG. 2 is a top plan view of MOSFET device 20 formed as a trench semiconductor device according to another embodiment of the present invention. MOSFET device 20 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of closed rectangles, enclosed by exterior trench 16. In the pattern shown, the sides of each closed rectangle formed by interior trenches 14 are separated from one another by interior gap distance $G_I$. Each interior trench 14 has a trench width $W_T$, and interior trenches 14 are spaced from exterior trench 16 by gap distance $G_E$.

In an exemplary embodiment, gap distance $G_I$ may be about 2 μm, trench width $W_T$ may be about 1.4 μm, and gap distance $G_E$ may be about 2 μm.

Figure 3:
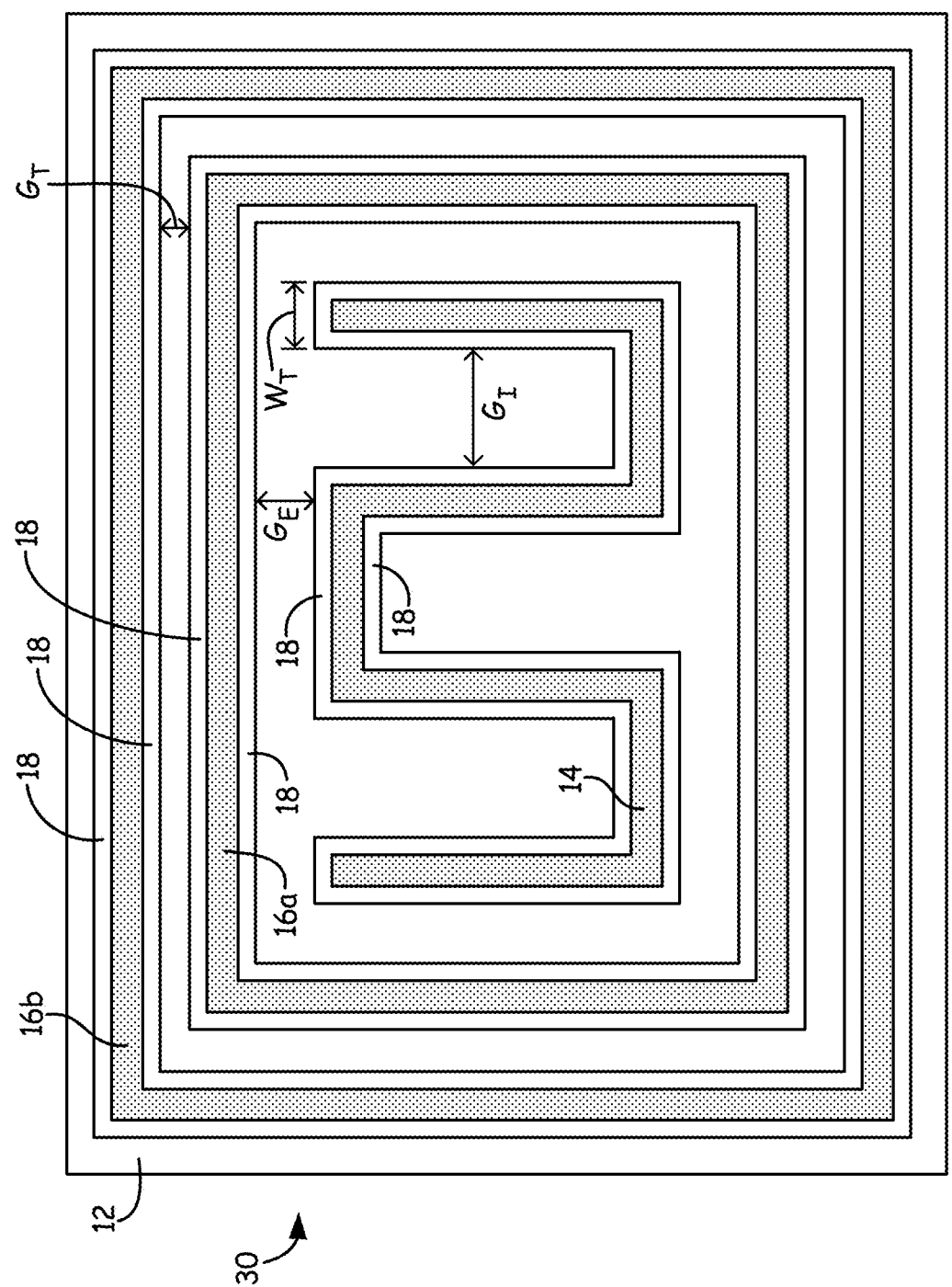

FIG. 3 is a top plan view of MOSFET device 30 formed as a trench semiconductor device according to another embodiment of the present invention. MOSFET device 30 includes semiconductor layer 12, a plurality of interior trenches 14 formed in semiconductor layer 12, intermediate trench 16a formed in semiconductor layer 12, and exterior trench 16b formed in semiconductor layer 12. Interior trenches 14, intermediate trench 16a and exterior trench 16b are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by intermediate trench 16a, and intermediate trench 16a is enclosed by exterior trench 16b. In the snake pattern, the legs of interior trenches 14 are separated from one another by interior gap distance $G_I$. Each leg of interior trenches 14 has a trench width $W_T$, and interior trenches 14 are spaced from intermediate trench 16a by gap distance $G_E$. Intermediate trench 16a is separated from exterior trench 16b by gap distance $G_T$.

In an exemplary embodiment, gap distance $G_I$ may be about 2 μm, trench width $W_T$ may be about 1.4 μm, gap distance $G_E$ may be about 2 μm, and gap distance $G_T$ may be about 2 μm.

Figure 4:
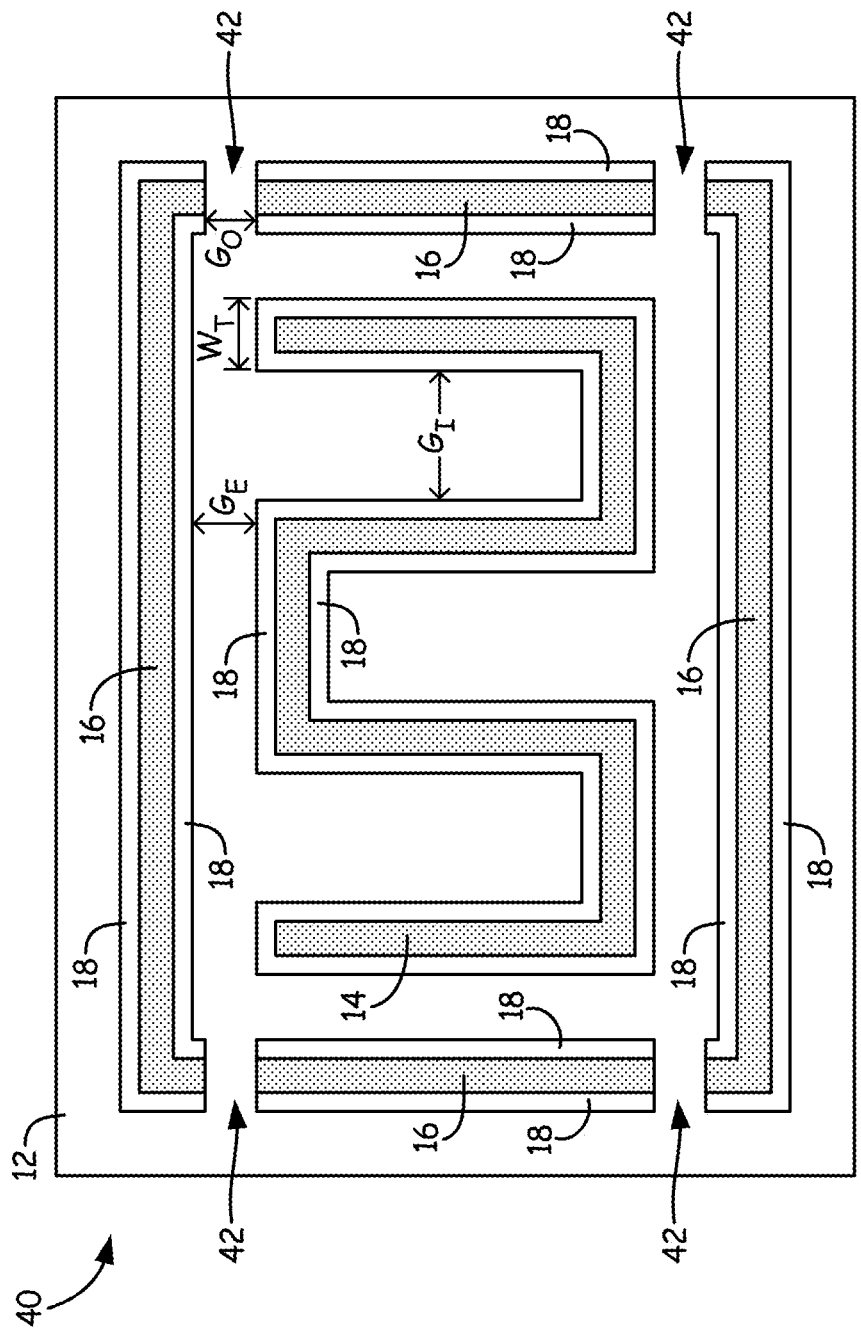

FIG. 4 is a top plan view of MOSFET device 40 formed as a trench semiconductor device according to another embodiment of the present invention. MOSFET device 40 includes semiconductor layer 12, a plurality of interior trenches 14 formed in semiconductor layer 12, and segmented exterior trench 16 having gaps 42 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern partially enclosed by segmented exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$. Gaps 42 in segmented exterior trench 16 have a gap length $G_O$.

In an exemplary embodiment, gap distance $G_I$ may be about 2 μm, trench width $W_T$ may be about 1.4 μm, gap distance $G_E$ may be about 2 μm, and gap length $G_O$ may be about 2 μm.

Figure 5:
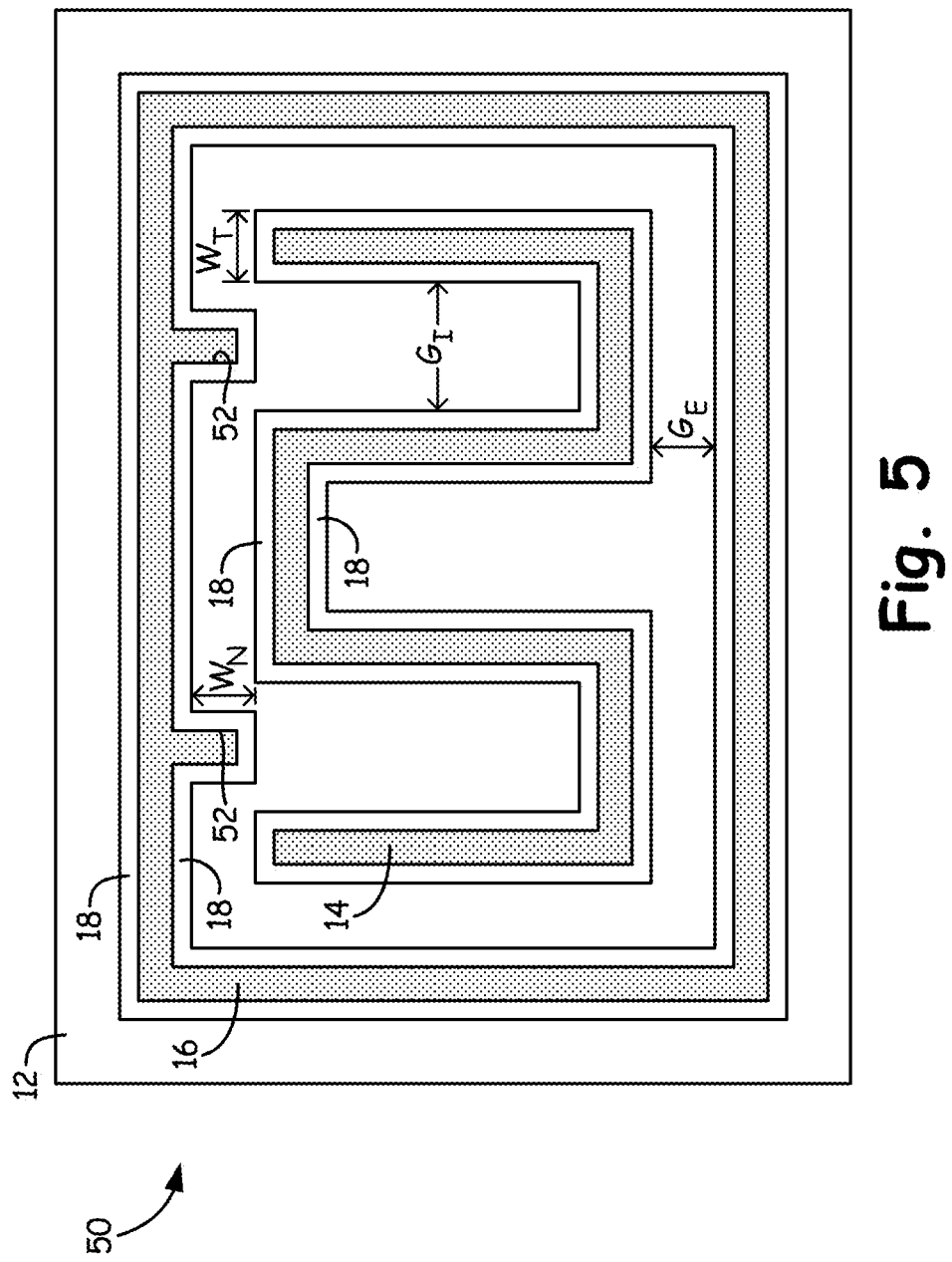

FIG. 5 is a top plan view of MOSFET device 50 formed as a trench semiconductor device according to another embodiment of the present invention. MOSFET device 50 includes semiconductor layer 12, a plurality of interior trenches 14 formed in semiconductor layer 12, and exterior trench 16 having notch features 52 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by exterior trench 16. In the snake pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$. Notch features 52 in exterior trench 16 are formed adjacent to openings between the legs of the snake pattern of interior trench 14, and each notch feature has an extending width $W_N$.

In an exemplary embodiment, gap distance $G_I$ may be about 2 μm, trench width $W_T$ may be about 1.4 μm, gap distance $G_E$ may be about 2 μm, and extending width $W_N$ may be about 0.5 μm.

Figure 6:
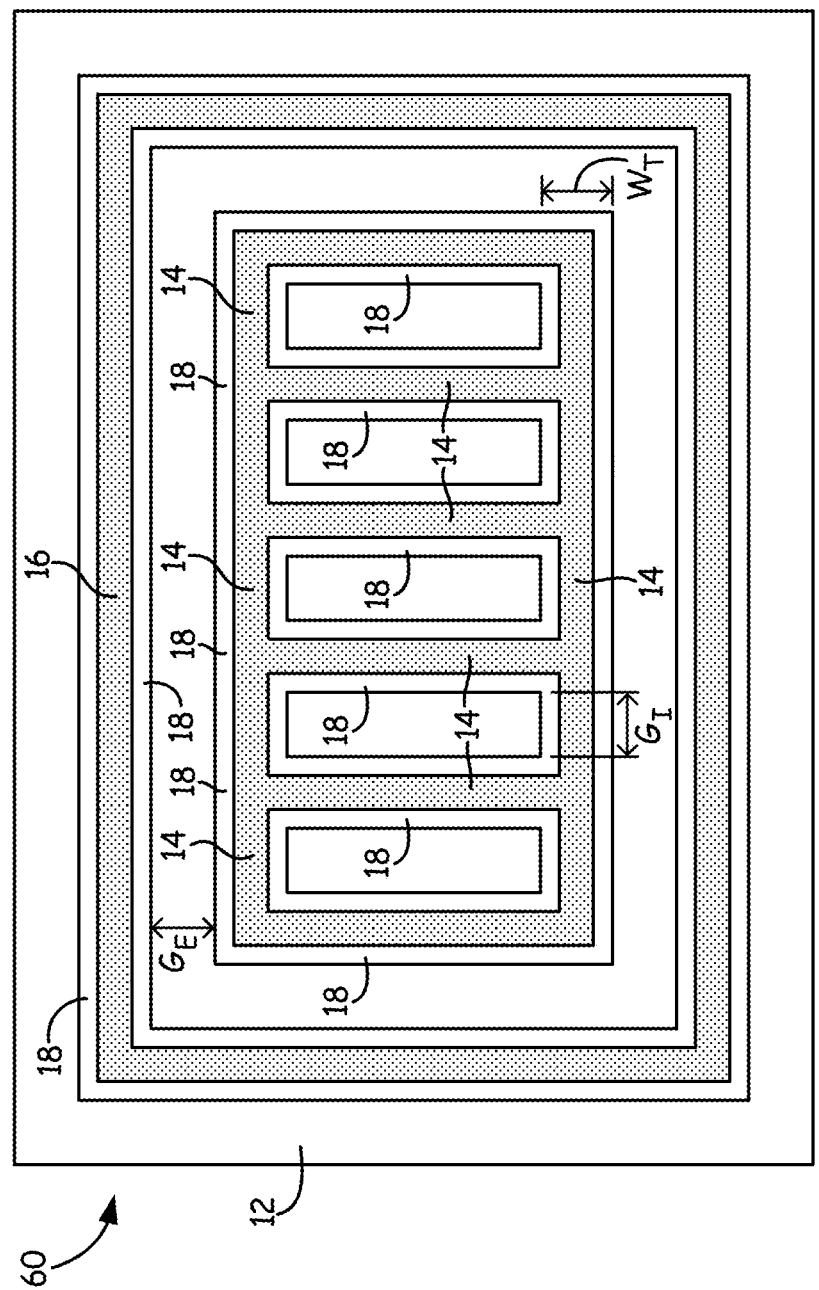

FIG. 6 is a top plan view of MOSFET device 60 formed as a trench semiconductor device according to another embodiment of the present invention. MOSFET device 60 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern having an outer frame and a plurality of vertical trench legs connecting the top and bottom horizontal segments of the outer frame. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$.

In an exemplary embodiment, gap distance $G_I$ may be about 2 μm, trench width $W_T$ may be about 1.4 μm, and gap distance $G_E$ may be about 2 μm.

Figure 7:
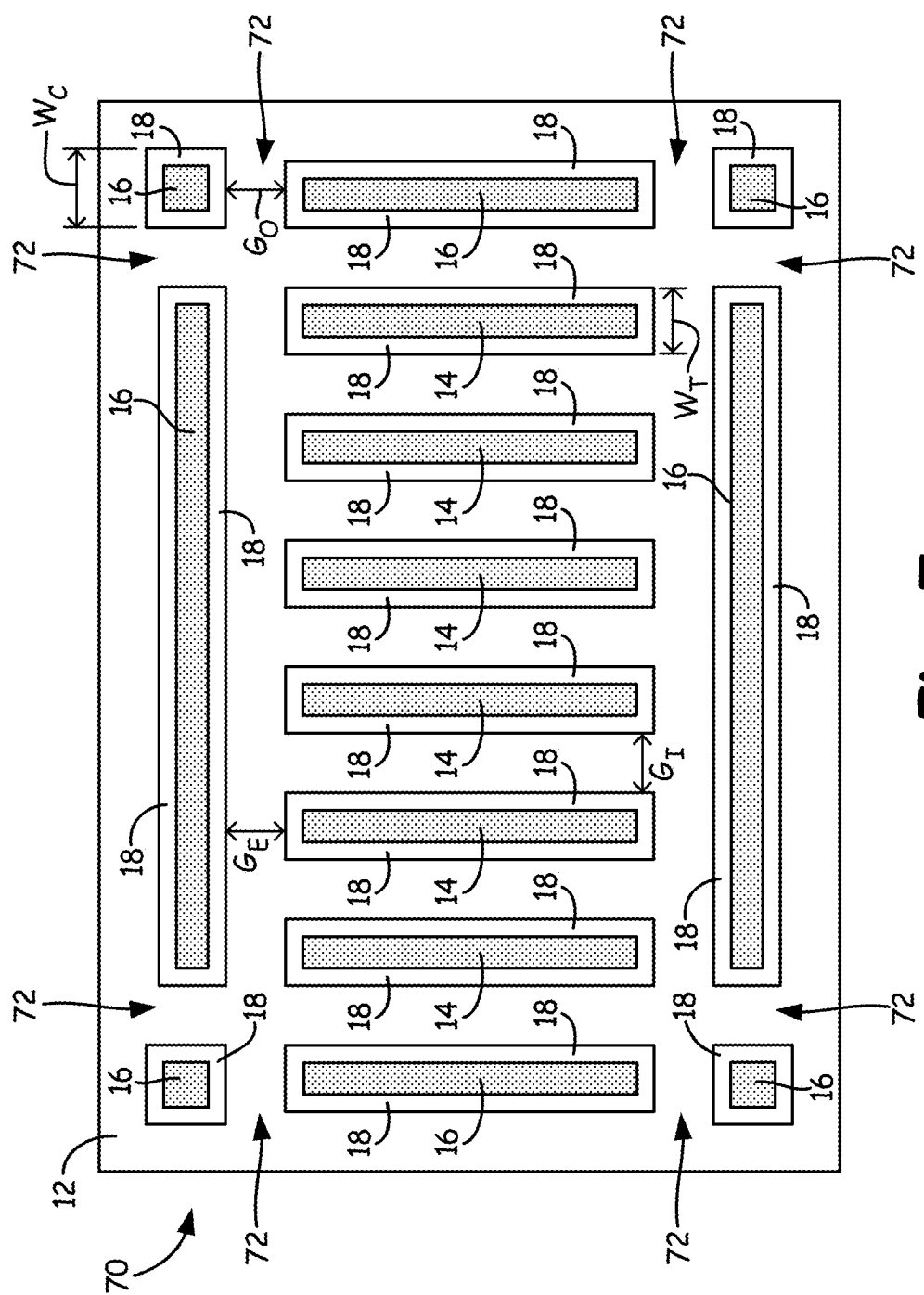

FIG. 7 is a top plan view of MOSFET device 70 formed as a trench semiconductor device according to another embodiment of the present invention. MOSFET device 70 includes semiconductor layer 12, a plurality of interior trenches 14 formed in semiconductor layer 12, and segmented exterior trench 16 having gaps 72 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Gaps 72 in segmented exterior trench 16 have a gap length $G_O$.

Figure 7A:
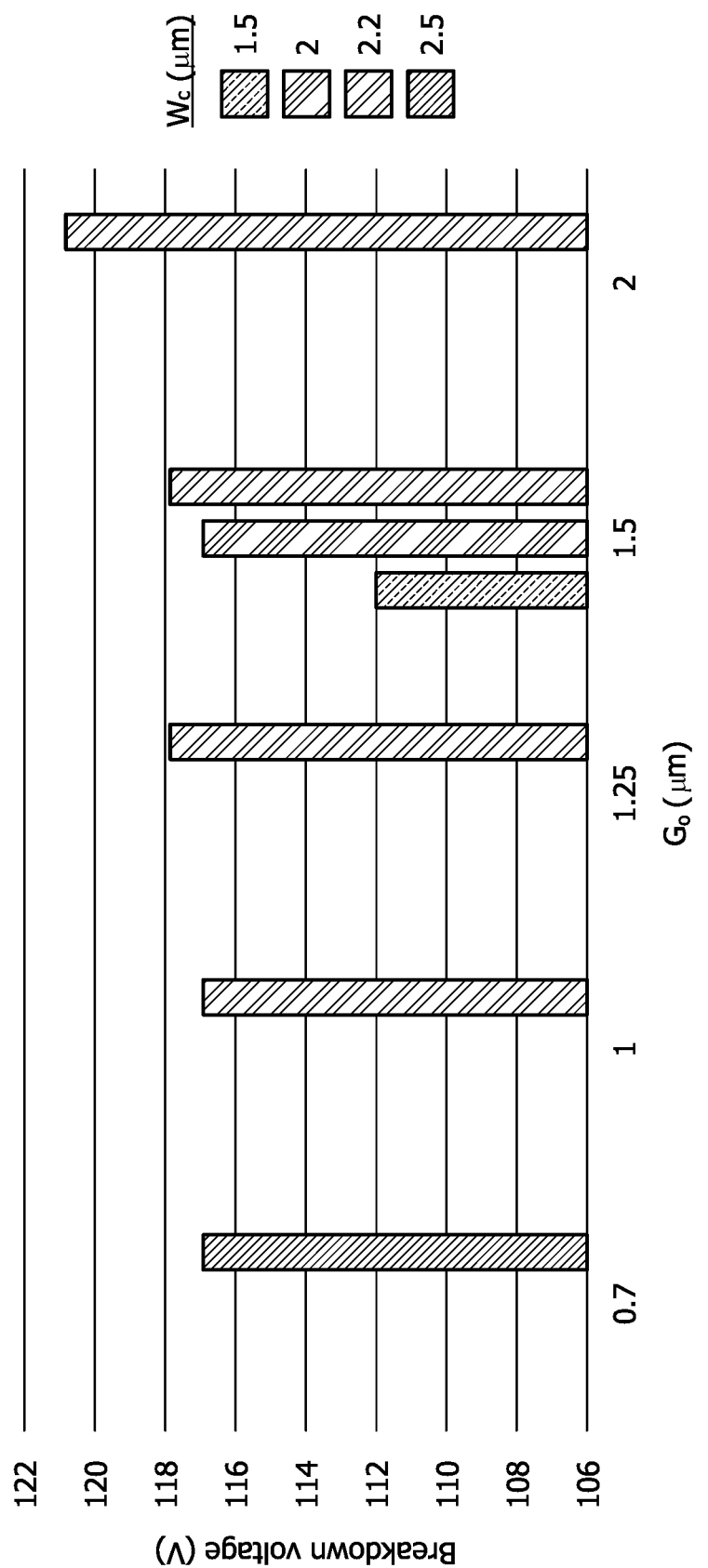
FIG. 7A is a graph illustrating the measured breakdown voltages of a MOSFET device according to the embodiment of FIG. 7 for various dimensions of trench corner width and exterior trench gap length.

In an exemplary embodiment, gap distance $G_I$ may be about 2 µm, trench width $W_T$ may be about 1.4 µm, gap distance $G_E$ may be about 2 µm, gap length $G_O$ may be about 1.7 µm, and trench corner width $W_C$ may be about 1.5 µm. In other embodiments, these dimensions may be adjusted to control the breakdown voltage at the termination of MOSFET device 70. FIG. 7A is a graph illustrating the measured breakdown voltages of MOSFET device 70 for various dimensions of trench corner width $W_C$ and exterior trench gap length $G_O$. As can be seen in FIG. 7A, the dimensions of trench corner width $W_C$ and exterior trench gap length $G_O$ affect the breakdown voltage of the device, and can be controlled in order to provide a desired breakdown voltage value.

Specific examples are shown in FIG. 7A, illustrating that a breakdown voltage of 117 Volts was achieved for an embodiment with exterior trench gap length $G_O$ of 0.7 µm and a trench corner width $W_C$ of 2.5 µm. A similar breakdown voltage of 117 Volts was also achieved for an embodiment with an exterior trench gap length $G_O$ of 1.0 µm and a trench corner width $W_C$ of 2.2 µm. A breakdown voltage of 118 Volts was achieved for an embodiment with an exterior trench gap length $G_O$ of 1.25 µm and a trench corner width $W_C$ of 2.2 µm. At an exterior trench gap length $G_O$ of 1.5 µm, a breakdown voltage of 112 Volts was achieved for an embodiment with a trench corner width $W_C$ of 1.5 µm, a breakdown voltage of 117 Volts was achieved for an embodiment with a trench corner width $W_C$ of 2.0 µm, and a breakdown voltage of 118 Volts was achieved for an embodiment with a trench corner width $W_C$ of 2.2 µm. A breakdown voltage of 121 Volts was achieved for an embodiment with an exterior trench gap length $G_O$ of 2.0 µm and a trench corner width $W_C$ of 2.2 µm.

Figure 8:
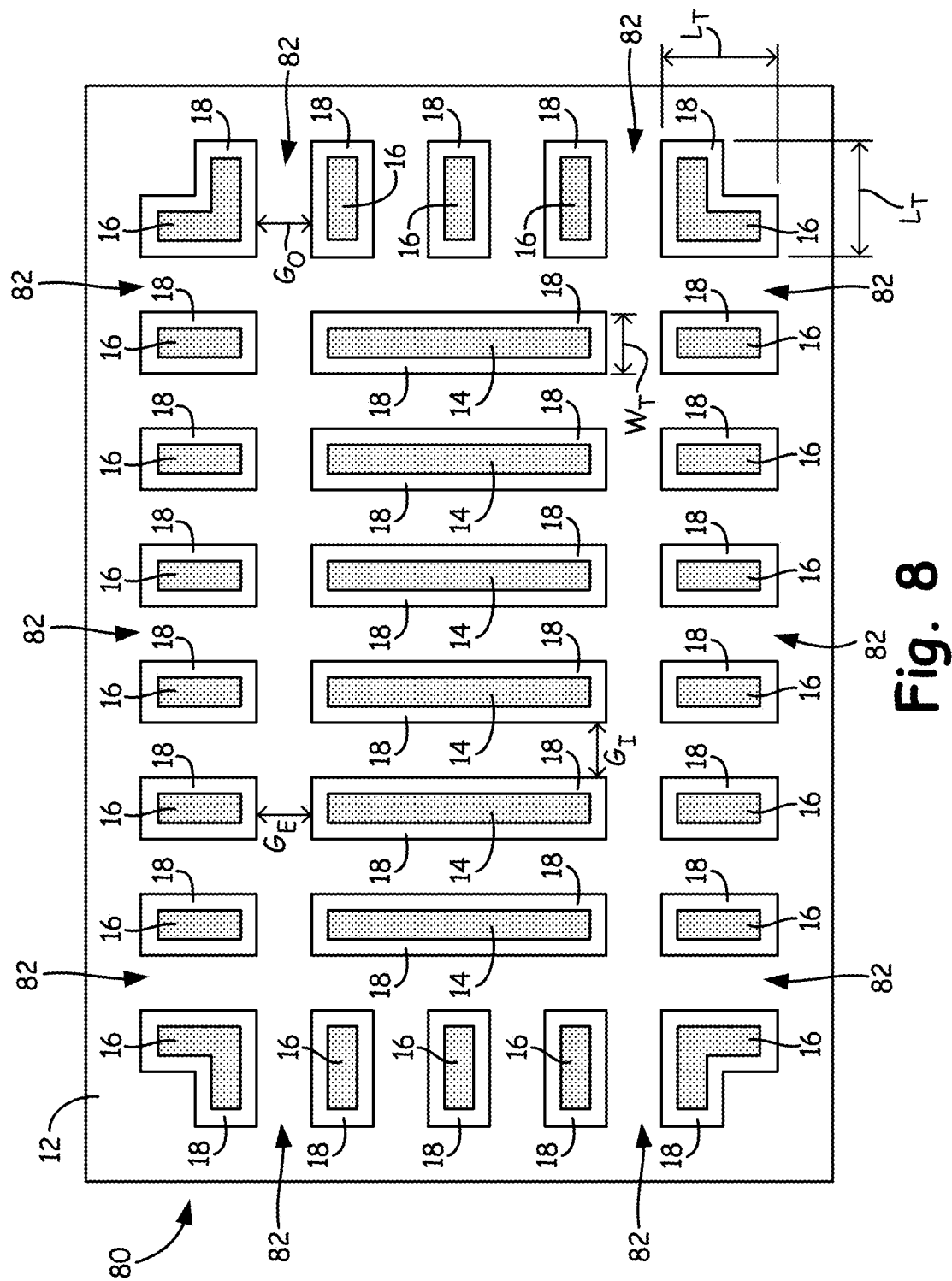

FIG. 8 is a top plan view of MOSFET device 80 formed as a trench semiconductor device according to another embodiment of the present invention. MOSFET device 80 includes semiconductor layer 12, a plurality of interior trenches 14 formed in semiconductor layer 12, and segmented exterior trench 16 having gaps 82 therein formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Gaps 82 in segmented exterior trench 16 have a gap length $G_O$. Exterior trench 16 is segmented in the embodiment shown in FIG. 8 so that the segments of exterior trench 16 line up with the legs of interior trench 14.

Figure 8A:
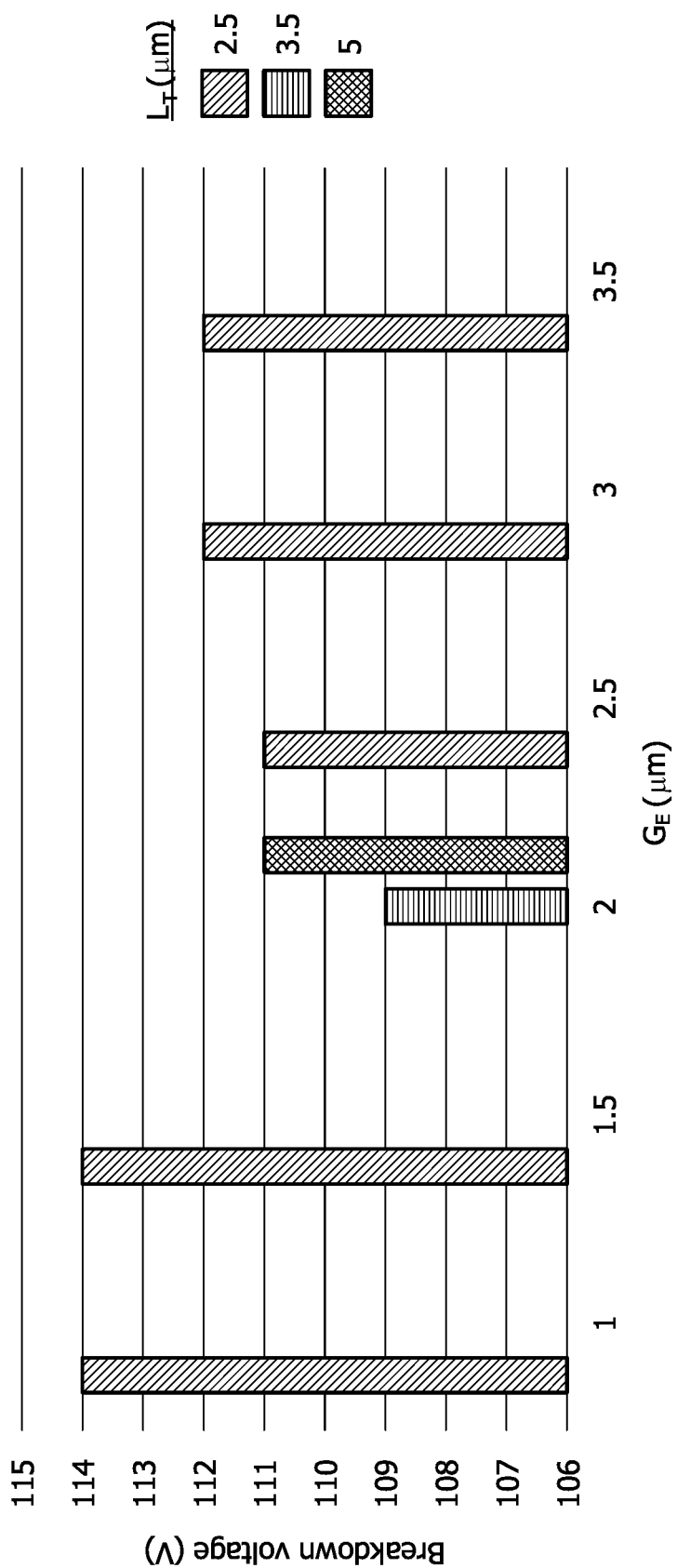
FIG. 8A is a graph illustrating the measured breakdown voltages of a MOSFET device according to the embodiment of FIG. 8 for various dimensions of gap distance and exterior trench length.

In an exemplary embodiment, gap distance $G_I$ may be about 2 µm, trench width $W_T$ may be about 1.4 µm, gap distance $G_E$ may be about 2 µm, and exterior trench length $L_T$ may be about 2 µm. In other embodiments, these dimensions may be adjusted to control the breakdown voltage at the termination of MOSFET device 80. FIG. 8A is a graph illustrating the measured breakdown voltages of MOSFET device 80 for various dimensions of gap distance $G_E$ and exterior trench length $L_T$. As can be seen in FIG. 8A, the dimensions of gap distance $G_E$ and exterior trench length $L_T$ affect the breakdown voltage of the device, and can be controlled in order to provide a desired breakdown voltage value.

Specific examples are shown in FIG. 8A, illustrating that a breakdown voltage of 114 Volts was achieved for an embodiment with a gap distance $G_E$ of 1.0 µm and an exterior trench length $L_T$ of 2.5 µm. A similar breakdown voltage of 114 Volts was also achieved for an embodiment with a gap distance $G_E$ of 1.5 µm and an exterior trench length $L_T$ of 2.5 µm. At a gap distance $G_E$ of 2.0 µm, a breakdown voltage of 109 Volts was achieved for an embodiment with an exterior trench length $L_T$ of 3.5 µm, and a breakdown voltage of 111 Volts was achieved for an embodiment with an exterior trench length $L_T$ of 5.0 µm. A breakdown voltage of 111 Volts was achieved for an embodiment with a gap distance $G_E$ of 2.5 µm and exterior trench length $L_T$ of 2.5 µm. A breakdown voltage of 112 Volts was achieved for an embodiment with a gap distance $G_E$ of 3.0 µm and exterior trench length $L_T$ of 2.5 µm, and also for an embodiment with a gap distance $G_E$ of 3.5 µm and exterior trench length $L_T$ of 2.5 µm.

Figure 9:
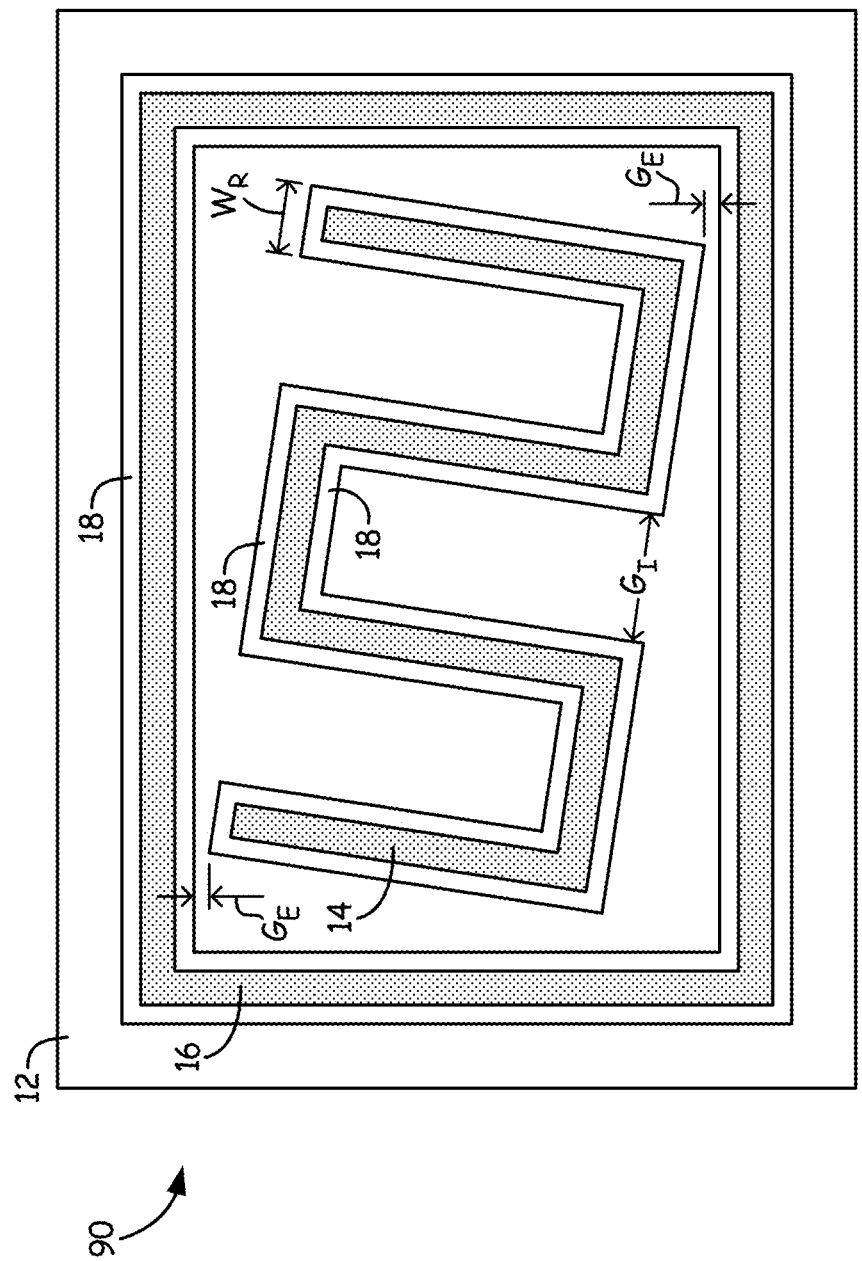

FIG. 9 is a top plan view of MOSFET device 90 formed as a trench semiconductor device according to another embodiment of the present invention. MOSFET device 90 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a snake pattern enclosed by exterior trench 16. The snake pattern is angled diagonally within exterior trench 16 as shown in FIG. 9. In the snake pattern, the legs of interior trenches 14 are separated from one another by interior gap distance $G_I$. Each leg of interior trenches 14 has a trench width $W_T$, and interior trenches 14 are spaced from exterior trench 16 by a minimum gap distance $G_E$.

In an exemplary embodiment, gap distance $G_I$ may be about 2 µm, trench width $W_T$ may be about 1.4 µm, and gap distance $G_E$ may be about 2 µm.

Figure 10:
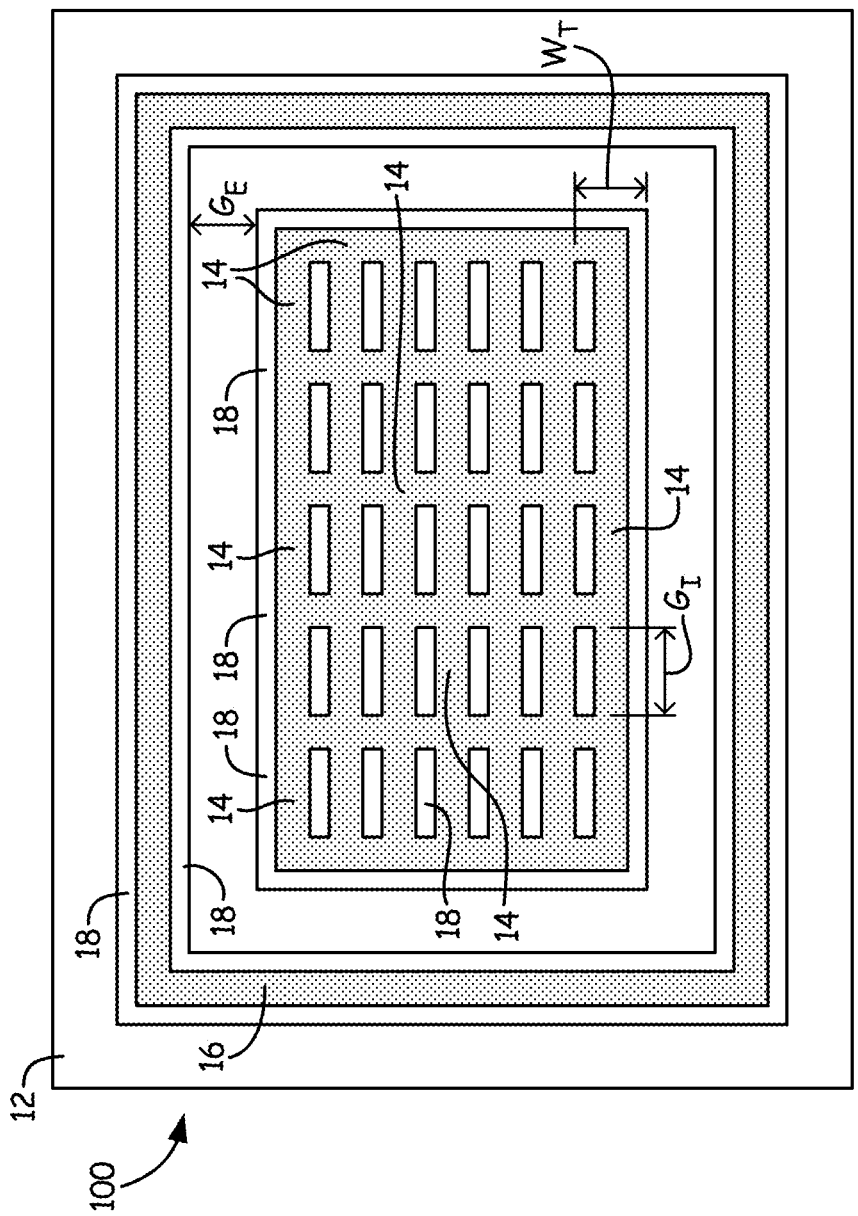

FIG. 10 is a top plan view of MOSFET device 100 formed as a trench semiconductor device according to another embodiment of the present invention. MOSFET device 100 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a grid pattern enclosed by exterior trench 16. In the grid pattern, the legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, gap distance $G_I$ may be about 4.5 µm, trench width $W_T$ may be about 1.4 µm, and gap distance $G_E$ may be about 2 µm.

Figure 11:
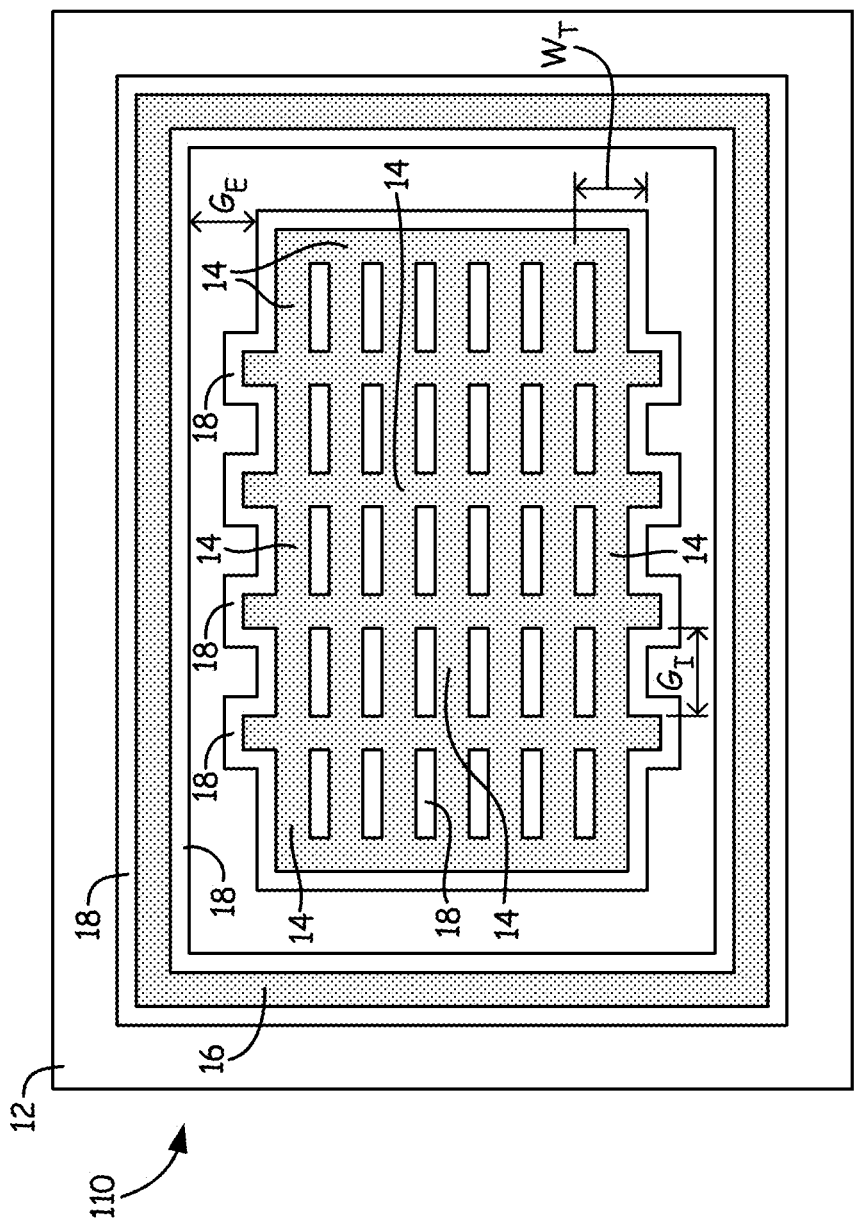

FIG. 11 is a top plan view of MOSFET device 110 formed as a trench semiconductor device according to another embodiment of the present invention. MOSFET device 110 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a grid pattern enclosed by exterior trench 16. In the grid pattern, the legs of interior trenches 14 are separated from one another by interior gap distance $G_I$. The vertical legs of interior trenches 14 extend beyond a square/rectangular grid pattern at vertical trench extensions 112. Each leg of interior trenches 14 has a trench width $W_T$, and interior trenches 14 are spaced from exterior trench 16 by gap distance $G_E$.

In an exemplary embodiment, gap distance $G_I$ may be about 4.5 μm, trench width $W_T$ may be about 1.4 μm, and gap distance $G_E$ may be about 2 μm.

Figure 12:
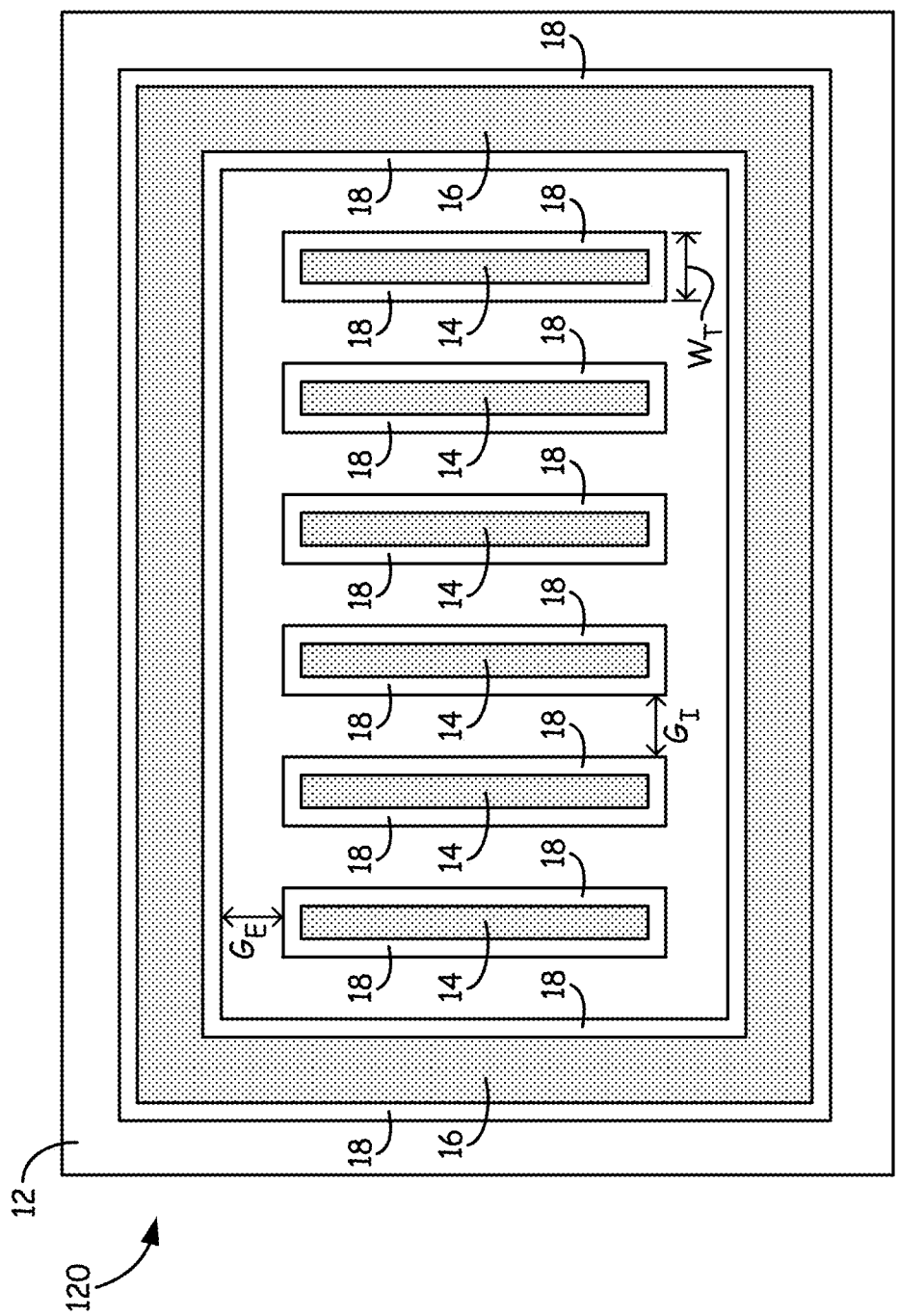

FIG. 12 is a top plan view of MOSFET device 120 formed as a trench semiconductor device according to another embodiment of the present invention. MOSFET device 120 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$. Exterior trench 16 has a trench width that is greater than the trench width $W_T$ of interior trenches 14, such as twice the trench width $W_T$ in an exemplary embodiment.

In an exemplary embodiment, gap distance $G_I$ may be about 2.0 μm, trench width $W_T$ may be about 1.4 μm, and gap distance $G_E$ may be about 2 μm.

Figure 13:
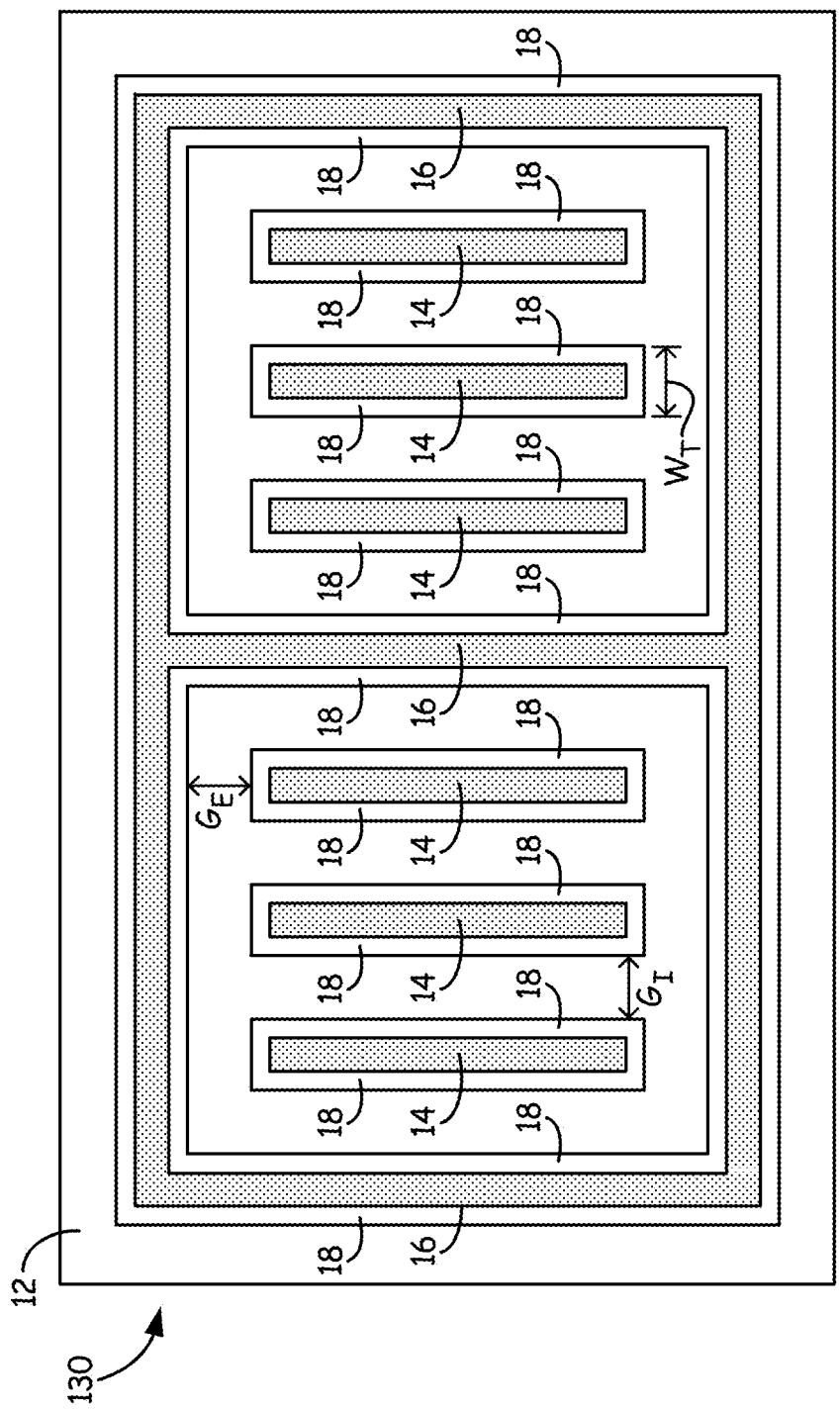

FIG. 13 is a top plan view of MOSFET device 130 formed as a trench semiconductor device according to another embodiment of the present invention. MOSFET device 130 includes semiconductor layer 12, a plurality of interior trenches 14 formed in semiconductor layer 12, and exterior trench 16 formed in semiconductor layer 12. Middle dividing trench 136 is also formed in semiconductor layer 12, dividing the interior region inside exterior trench 16 into two separate regions, each of which includes a plurality of interior trenches 14. Interior trenches 14, exterior trench 16 and middle dividing trench 136 are lined with dielectric material 18, such as silicon dioxide in some embodiments, and the dielectric lined trenches are filled with a conductive material (not shown) such as a metal or doped polysilicon. Interior trenches 14 are formed in a pattern of vertical trench legs. In the pattern shown, the vertical legs of interior trenches 14 are separated from one another by interior gap distance $G_I$. Interior trenches 14 have a trench width $W_T$, and interior trenches 14 are spaced from exterior trench 16 by gap distance $G_E$.

In an exemplary embodiment, gap distance $G_I$ may be about 2.0 μm, trench width $W_T$ may be about 1.4 μm, and gap distance $G_E$ may be about 2 μm.

Figure 14:
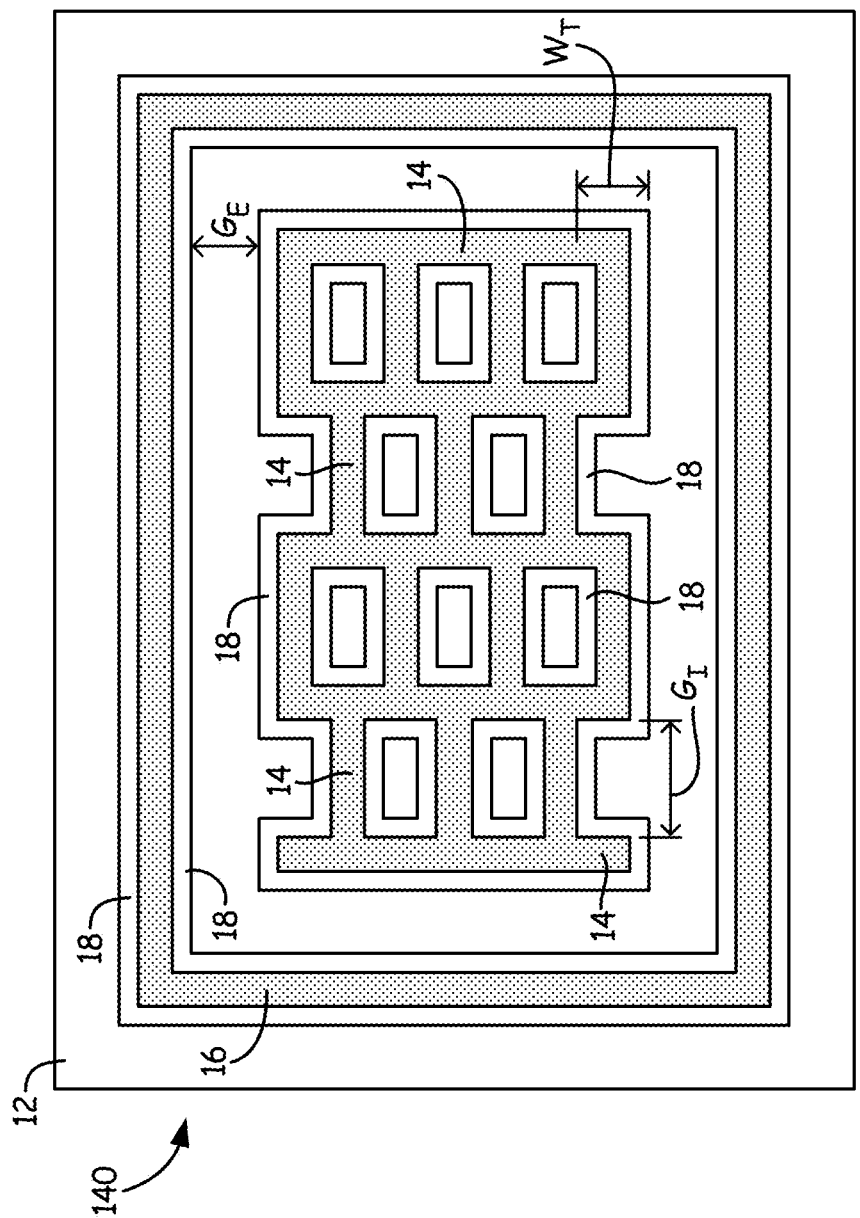

FIG. 14 is a top plan view of MOSFET device 140 formed as a trench semiconductor device according to another embodiment of the present invention. MOSFET device 140 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in an offset grid pattern enclosed by exterior trench 16, as shown in FIG. 14. In the grid pattern, the vertical legs of interior trenches 14 are separated from one another by interior gap distance $G_I$, as are adjacent horizontal legs of interior trenches 14. Each leg of interior trenches 14 has a trench width $W_T$, and interior trenches 14 are spaced from exterior trench 16 by gap distance $G_E$.

In an exemplary embodiment, gap distance $G_I$ may be about 4.5 μm, trench width $W_T$ may be about 1.4 μm, and gap distance $G_E$ may be about 2 μm.

Figure 15:
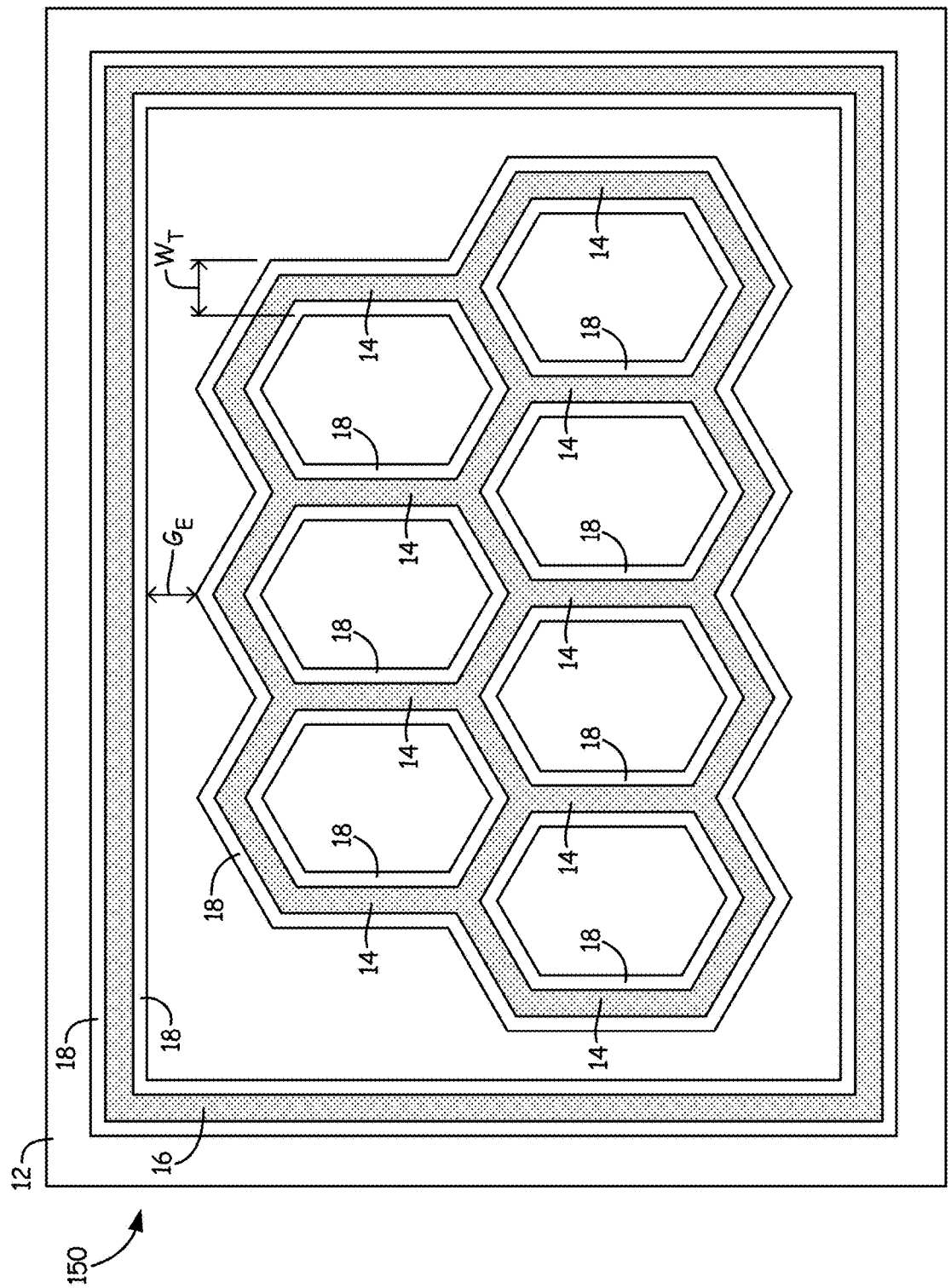

FIG. 15 is a top plan view of MOSFET device 150 formed as a trench semiconductor device according to another embodiment of the present invention. MOSFET device 150 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a honeycomb pattern enclosed by exterior trench 16, as shown in FIG. 15. In the honeycomb pattern, adjacent vertical legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, trench width $W_T$ may be about 1.4 μm, and gap distance $G_E$ may be about 2 μm.

Figure 16:
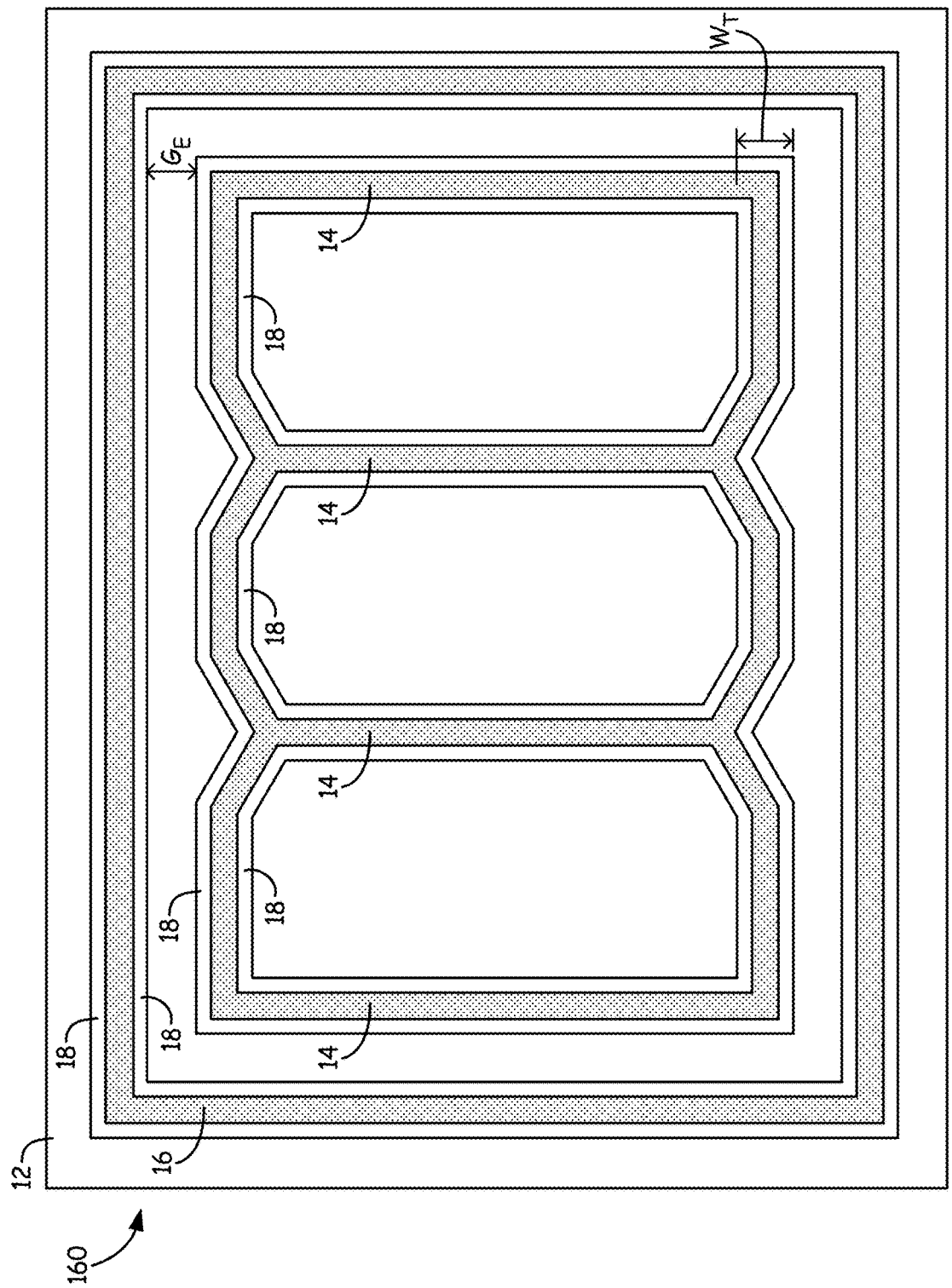

FIG. 16 is a top plan view of MOSFET device 160 formed as a trench semiconductor device according to another embodiment of the present invention. MOSFET device 160 includes semiconductor layer 12, a plurality of interior trenches 14 formed in semiconductor layer 12, and exterior trench 16 formed in semiconductor layer 12. Interior trenches 14 and exterior trench 16 are lined with dielectric material 18, such as silicon dioxide in some embodiments, and the dielectric lined trenches are filled with a conductive material (not shown) such as a metal or doped polysilicon. Interior trenches 14 are formed in a geometric trench pattern formed of six sided polygons and eight sided polygons enclosed by exterior trench 16, as shown in FIG. 16. In the geometric trench pattern, adjacent vertical legs of interior trenches 14 are separated from one another by interior gap distance $G_I$. Each leg of interior trenches 14 has a trench width $W_T$, and interior trenches 14 are spaced from exterior trench 16 by gap distance $G_E$.

In an exemplary embodiment, trench width $W_T$ may be about 1.4 μm, and gap distance $G_E$ may be about 2 μm.

The embodiments of the present invention disclosed herein include geometric features that can be mixed and matched with any other disclosed embodiments. For example, the segmented outer trench 16 shown in FIG. 7 may be used with the snake trench pattern shown in FIG. 1A in an alternative embodiment. Other features may also be combined and modified to form additional alternative embodiments and configurations.

In many of the embodiments disclosed herein, modifications of the dimensions of trenches or other features, as well as of gaps between trenches or other features, are able to be modified in order to adjust the performance of the device, such as the breakdown voltage of the device. Examples of such modifications and the resulting performance adjustments are discussed specifically with respect to the embodiments of FIGS. 7 and 8, and modifications to others of the disclosed embodiments will also result in performance adjustments that may be selected and optimized for a particular application.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the description herein.

The invention claimed is:

1. A trench semiconductor device comprising:
   a layer of semiconductor material;
   an exterior trench pattern formed in the layer of semiconductor material, the exterior trench pattern including first and second parallel exterior trench portions that form first and third opposite sides of a rectangle shape, and third and fourth parallel exterior trench portions connected to and perpendicular to the first and second parallel exterior trench portions that form second and fourth opposite sides of the rectangle shape, each of the first, second, third and fourth exterior trench portions being lined with dielectric material and filled with conductive material;
   an interior trench pattern formed in the layer of semiconductor material, at least partially surrounded by the exterior trench pattern, the interior trench pattern including a plurality of interior trench portions that are each lined with dielectric material and filled with conductive material, the plurality of interior trench portions being arranged parallel to one another and parallel to the third and fourth parallel exterior trench portions that form the second and fourth opposite sides of the rectangle shape, and being separated from the first, second, third and fourth exterior trench portions of the exterior trench pattern; and
   a dividing trench portion that is parallel to the third and fourth exterior trench portions, and extends between and connects the first and second parallel exterior trench portions to form a first interior region and a second interior region inside the exterior trench pattern separated from each other by the dividing trench portion, such that a first plurality of the plurality of interior trench portions are located in the first interior region on a first side of the dividing trench portion and a second plurality of the plurality of interior trench portions are located in the second interior region on a second side of the dividing trench portion.

2. The trench semiconductor device of claim 1, wherein:
   the first and second parallel exterior trench portions that form the first and third opposite sides of a rectangle shape form long sides of the rectangle shape; and
   the third and fourth parallel exterior trench portions that form the second and fourth opposite sides of the rectangle shape form short sides of the rectangle shape.

3. The trench semiconductor device of claim 1, wherein the dividing trench portion is located halfway between the third exterior trench portion and the fourth exterior trench portion.

4. The trench semiconductor device of claim 2, wherein the dividing trench portion is located halfway between the third exterior trench portion and the fourth exterior trench portion.

5. The trench semiconductor device of claim 1, wherein the plurality of interior trench portions are separated from one another by an interior gap distance of about 2.0 µm.

6. The trench semiconductor device of claim 1, wherein the plurality of interior trench portions have a first trench width, and the first, second, third and fourth exterior trench portions have a second trench width, wherein the second trench width is greater than the first trench width.

7. The trench semiconductor device of claim 6, wherein the second trench width is twice the first trench width.

8. The trench semiconductor device of claim 1, wherein the plurality of interior trench portions have a first trench width that is about 1.4 µm.

9. The trench semiconductor device of claim 1, wherein the plurality of interior trench portions are separated from the first, second, third and fourth exterior trench portions of the exterior trench pattern by about 2.0 µm.

* * * * *